(12) United States Patent
Schelling et al.

(10) Patent No.: US 9,571,938 B2
(45) Date of Patent: Feb. 14, 2017

(54) MICROPHONE ELEMENT AND DEVICE FOR DETECTING ACOUSTIC AND ULTRASOUND SIGNALS

(71) Applicant: Robert Bosch GmbH, Stuttgart (DE)

(72) Inventors: Christoph Schelling, Stuttgart (DE); Rolf Scheben, Stuttgart (DE); Ricardo Ehrenpfordt, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/558,993

(22) Filed: Dec. 3, 2014

(65) Prior Publication Data
US 2015/0156591 A1 Jun. 4, 2015

(30) Foreign Application Priority Data
Dec. 3, 2013 (DE) .......................... 10 2013 224 718

(51) Int. Cl.
*H04R 23/00* (2006.01)
*H04R 19/00* (2006.01)
(Continued)

(52) U.S. Cl.
CPC ........... *H04R 19/005* (2013.01); *B81B 3/0018* (2013.01); *B81B 3/0021* (2013.01);
(Continued)

(58) Field of Classification Search
CPC . H04R 2201/003; H04R 19/005; H04R 19/04; H04R 29/004; B81B 3/0021; B81B 2201/0285; B81B 2201/0221; B81B 3/0018; B81B 2201/0257
(Continued)

(56) References Cited

U.S. PATENT DOCUMENTS 5,677,965 A * 10/1997 Moret .................. H04R 19/005
                                                    381/113
5,870,482 A *  2/1999 Loeppert ............... B81B 3/0072
                                                    381/174
(Continued)

FOREIGN PATENT DOCUMENTS

DE      102012215251    3/2013
DE      102012203900    9/2013
WO      WO2010/119168  10/2010

*Primary Examiner* — Davetta W Goins
*Assistant Examiner* — Oyesola C Ojo
(74) *Attorney, Agent, or Firm* — Norton Rose Fulbright US LLP; Gerard Messina

(57) ABSTRACT

A capacitive MEMS microphone element is described which may be used optionally for detecting acoustic signals (microphone mode) or for detecting ultrasound signals in a defined frequency range (ultrasound mode). In the layered structure of the MEMS microphone element, at least two carrier elements for the two electrode sides of a capacitor system are formed one above the other and at a distance from one another for signal detection. At least one of the two carrier elements is sound pressure-sensitive and at least one of the two electrode sides includes at least two electrode segments which are electrically contactable independent of one another, which together with the at least one electrode of the other electrode side form partial capacitances which are independent of one another.

12 Claims, 3 Drawing Sheets

(51) Int. Cl.
*B81B 3/00* (2006.01)
*H04R 19/04* (2006.01)
*H04R 29/00* (2006.01)

(52) U.S. Cl.
CPC ............... *B81B 2201/0221* (2013.01); *B81B 2201/0257* (2013.01); *B81B 2201/0285* (2013.01); *H04R 19/04* (2013.01); *H04R 29/004* (2013.01)

(58) Field of Classification Search
USPC .................................................. 381/174, 191
See application file for complete search history.

(56) References Cited

U.S. PATENT DOCUMENTS

| | | | | |
|---|---|---|---|---|
| 6,151,967 A * | 11/2000 | McIntosh | B81B 3/0086 | 361/283.4 |
| 6,535,460 B2 * | 3/2003 | Loeppert | B81B 3/0072 | 367/181 |
| 7,146,016 B2 * | 12/2006 | Pedersen | B81B 3/0072 | 381/113 |
| 7,536,769 B2 * | 5/2009 | Pedersen | B81B 3/0072 | 156/89.11 |
| 7,612,483 B2 * | 11/2009 | Degertekin | B06B 1/0292 | 310/309 |
| 7,769,193 B2 * | 8/2010 | Matsuzawa | B06B 1/0292 | 381/111 |
| 7,912,235 B2 * | 3/2011 | Chen | H04R 19/04 | 381/174 |
| 8,008,835 B2 | 8/2011 | Degertekin | | |
| 8,120,229 B2 * | 2/2012 | Huang | B06B 1/0292 | 310/309 |
| 8,175,293 B2 * | 5/2012 | Suvanto | H04R 19/016 | 381/111 |
| 8,327,711 B2 * | 12/2012 | Kasai | H04R 19/005 | 73/649 |
| 8,582,788 B2 * | 11/2013 | Leidl | H04R 1/2838 | 381/173 |
| 8,942,394 B2 * | 1/2015 | Conti | | 381/174 |
| 9,148,726 B2 * | 9/2015 | Dehe | G01L 9/0016 | |
| 2008/0192962 A1 * | 8/2008 | Halteren | H04R 1/222 | 381/170 |
| 2008/0252595 A1 * | 10/2008 | Boillot | G06F 3/011 | 345/156 |
| 2010/0195851 A1 * | 8/2010 | Buccafusca | H04R 17/02 | 381/190 |
| 2010/0275675 A1 * | 11/2010 | Seppa | G01L 9/0041 | 73/24.01 |
| 2010/0284553 A1 * | 11/2010 | Conti | B81B 7/0061 | 381/174 |
| 2011/0003614 A1 * | 1/2011 | Langereis | G01S 15/06 | 455/550.1 |
| 2013/0044904 A1 * | 2/2013 | Margalit | H04R 1/22 | 381/182 |
| 2013/0100776 A1 | 4/2013 | Karl | | |
| 2013/0279717 A1 * | 10/2013 | Reimann | H04R 3/02 | 381/93 |
| 2014/0157904 A1 * | 6/2014 | Amm | G01S 7/521 | 73/632 |
| 2014/0270273 A1 * | 9/2014 | Muza | H04R 19/005 | 381/174 |
| 2015/0071467 A1 * | 3/2015 | Kaplan | H04R 17/00 | 381/190 |
| 2015/0139452 A1 * | 5/2015 | Park | H04R 23/00 | 381/150 |
| 2015/0146885 A1 * | 5/2015 | Fitzgerald | H04R 3/005 | 381/98 |

* cited by examiner

MICROPHONE ELEMENT AND DEVICE FOR DETECTING ACOUSTIC AND ULTRASOUND SIGNALS

FIELD OF THE INVENTION

The present invention relates to an MEMS microphone element, at least two carrier elements for the two electrode sides of a capacitor system being formed above one another and at a distance from one another in its layered structure for signal detection. At least one of the two carrier elements is sound pressure sensitive. Moreover, at least one of the two electrode sides includes at least two electrode segments which are electrically contactable independent of one another, which together with the at least one electrode of the other electrode side form partial capacitances which are independent of one another.

Furthermore, the present invention relates to a device including such an MEMS microphone element.

BACKGROUND INFORMATION

Capacitive MEMS microphone elements of the type discussed here are known from the related art. The microphone structure generally includes a sound pressure-sensitive diaphragm and one fixed acoustically permeable counter-element. These two components of the microphone structure are used as carrier elements for the electrodes of a microphone capacitor system. The sound pressure-related deflections of the diaphragm result in a change in distance between the diaphragm electrode and the counter-electrode on the fixed counter-element and consequently a change in the capacitance of the microphone capacitor system, which may be detected simply as a voltage change. The capacitive MEMS microphone elements known from the related art generally have a flat frequency response of 20 Hz to 20 kHz and are accordingly used exclusively for detecting acoustic signals.

An MEMS microphone element including a capacitor system for signal detection is described in WO 2010/119168 A1, one of its electrode sides including multiple electrode segments which are electrically isolated from one another. Together with the electrode or electrodes of the other electrode side, these electrode segments form partial capacitances which are independent from one another. According to WO 2010/119168 A1, these partial capacitances are used for adapting the microphone sensitivity to different signal levels, i.e., sound volume levels, of the acoustic signal. For that purpose, the output signal is formed as a sum of the partial capacitances, the number of added partial capacitances being selected as a function of the particular sound volume level. The lower the sound volume level, the greater is the number of added partial capacitances. Consequently, the number of partial capacitances determines the number of the sound volume ranges which may be differentiated.

SUMMARY

The present invention describes a capacitive MEMS microphone element, which may be used optionally for detecting acoustic signals (microphone mode) or for detecting ultrasound signals in a defined frequency range (ultrasound mode), as well as a device for operating such an MEMS microphone element.

According to the present invention, operation in ultrasound mode is achieved by a special layout of the electrode segments of at least one electrode side of the capacitor system of an MEMS microphone element of the type described here.

According to the present invention, the shape and extension of these electrode segments across the surface are determined by the position and extension of the vibration antinodes of the sound pressure-sensitive carrier element when the carrier element is excited to higher mode vibrations using ultrasound of a defined frequency.

According to the present invention, it has been found that a capacitor system including multiple partial capacitances which are independent from one another and may optionally be combined with one another may be used not only for adapting the microphone sensitivity to the signal level of an acoustic signal—as described in WO 2010/119168 A1, but may under certain conditions also be used for detecting signals in a defined higher frequency range. For that purpose, the present invention utilizes the fact that the sound pressure-sensitive diaphragm is deflected by acoustic signals in the first mode, while the diaphragm is excited to higher vibration modes by ultrasound signals.

In the first mode, the center area and the edge area of the diaphragm vibrate in phase, so that the center area and the edge area are deflected in the event of sound exposure in the same direction from the resting position. In this case, the diaphragm deflection may be simply detected as the sum of the partial capacitances.

If a suitable ultrasound excitation frequency is selected, however, the center area and the edge area vibrate in opposition, i.e., the center area and the edge area are in this case deflected from the resting position in opposite directions. These opposing deflections of the individual diaphragm areas may be detected and evaluated separately with the aid of appropriately situated and designed electrode segments.

Consequently, according to the present invention, the partial capacitances of an MEMS microphone element are to be designed specifically for the ultrasound mode; however, they are to be used not only for the ultrasound mode but also for detecting acoustic signals, i.e., for the microphone mode. In the design according to the present invention, these two operating modes differ practically only in the evaluation of the particular detected partial capacitances. Consequently, the same micromechanical microphone structure of an MEM element may be used both for detecting acoustic signals in the microphone mode and for detecting ultrasound signals in the ultrasound mode. The increased functionality of an MEMS microphone element designed in this way neither requires additional manufacturing costs nor additional space.

The ultrasound mode may be used advantageously for contactless control of devices, such as mobile telephones or tablets, for example, by gesture recognition, in which the hand is localized with the aid of ultrasound, and/or the speed of the hand is ascertained with the aid of the Doppler Effect.

Basically, there are various possibilities for implementing an MEMS microphone element having the electrode layout according to the present invention. This relates to both the microphone structure and the positioning of the electrodes and electrode segments on the carrier elements of the microphone structure. The microphone structure generally includes a sound pressure-sensitive diaphragm as a carrier element for at least one deflectable electrode and one more or less fixed, acoustically permeable counter-element as a carrier element for at least one counter electrode. The diaphragm may be formed in the layered structure or under the counter-element. It may be made up of multiple layers of different materials and be more or less thick. It may also have a rounded or even angular shape, and it may be incorporated into the layered structure of the element circumferentially or only via spring elements. All of these parameters act on the vibration properties of the diaphragm, so that they influence the design according to the present invention of the electrode segments.

According to the present invention, at least one electrode side of the microphone capacitor system includes multiple electrode segments, the layout of which is adapted to the position and extension of the vibration antinodes of the diaphragm in the case of a defined ultrasound excitation. This electrode side may be implemented either on the diaphragm or on the counter-element and may interact with a single flat electrode of the other electrode side. However, it is also conceivable that both electrode sides of the microphone capacitor system are equipped with electrode segments designed according to the present invention.

The essential advantage of the MEMS microphone element according to the present invention lies—as already mentioned—in its double functionality, namely the microphone function and the ultrasound mode for gesture recognition, which may be utilized for controlling a device. To be able to use both the microphone mode and the ultrasound mode of the MEMS microphone element according to the present invention, it should be operated in the context of a device having at least one optionally activatable ultrasound transmitter which, in the ultrasound mode, transmits ultrasound signals of a defined frequency, namely the frequency to which the layout of the electrode segments of the MEMS microphone element is tuned. Furthermore, this device advantageously includes means for signal evaluation, which differentiate between the microphone mode and ultrasound mode. This means that partial capacitances which are detected in the microphone mode are treated differently than partial capacitances which are detected in the ultrasound mode.

In one preferred specific embodiment of the present invention, the optionally activatable ultrasound transmitter transmits ultrasound signals of a higher mode of the resonance frequency of the sound pressure-sensitive diaphragm of the MEMS microphone element, preferably the resonance frequency, which excites the diaphragm to 6th mode vibrations. In this case, the resonance step-up of the excitation mode contributes to increased sensitivity in the ultrasound mode.

The signal evaluation in the microphone mode may simply be based on one partial capacitance or the sum of multiple or all partial capacitances, since the microphone diaphragm is excited only in the first mode in the event of sound exposure, and consequently all areas of the diaphragm are deflected from the resting position in the same direction. In a particularly advantageous specific embodiment of the present invention, however, the signal level, i.e., the sound volume of the acoustic signal, is classified first to add up more or fewer partial capacitances depending on it. In this way, it is possible to adapt the microphone sensitivity to the sound volume level of the acoustic signal in a simple manner.

According to the present invention, the frequency of the ultrasound excitation is selected in such a way that a higher vibration mode of the diaphragm is excited, in which at least the edge area and the center area of the diaphragm are deflected in opposition. Consequently, the partial capacitances corresponding to the antinodes in phase opposition are preferably added up phase shifted by 180°.

The signal evaluation in the ultrasound mode makes it possible to find the position of or localize objects. Moreover, the Doppler Effect may be utilized to also detect the velocity and direction of moved objects. In this connection, a frequency shift of approximately 1 kHz is to be expected, which thus still lies within the resonance peak of the excitation mode.

DETAILED DESCRIPTION

Figure 1:
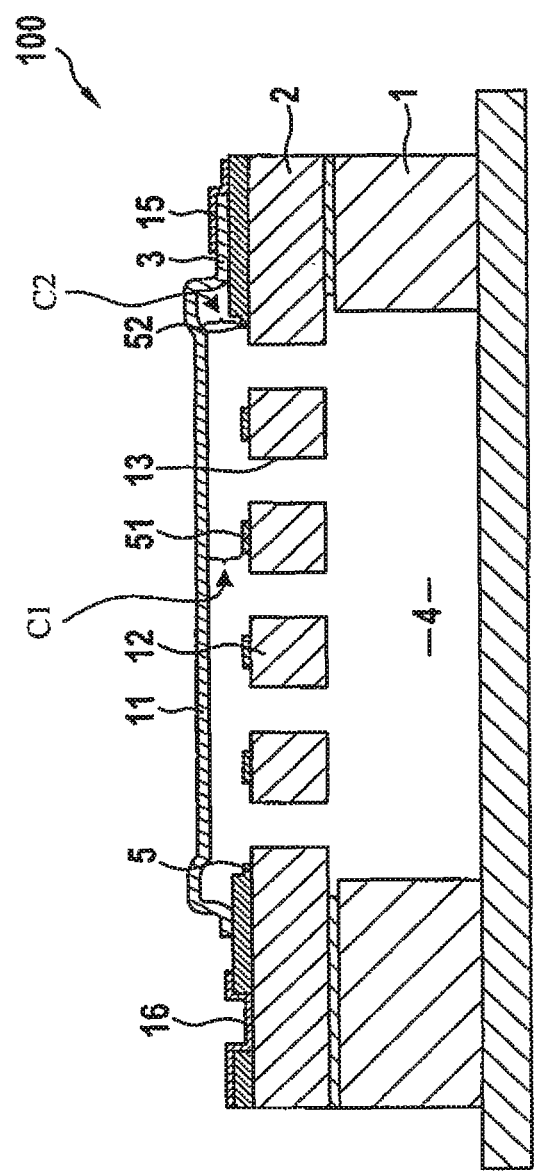
FIG. 1 shows a schematic sectional representation of the layered structure of an MEMS microphone element 100, which is equipped with a capacitor system according to the present invention for signal detection.

The microphone structure of MEMS element 100 shown in FIG. 1 is implemented in a layered structure on a substrate 1 and includes two carrier elements for both electrode sides of a capacitor system for signal detection, namely a sound pressure-sensitive diaphragm 11 and a fixed acoustically permeable counter-element 12. In the exemplary embodiment shown here, counter-element 12 is implemented in a thick layer 2 on substrate 1 and spans a cylindrical cavern 4 in the rear side of the substrate. In the area above cavern 4, passage openings 13 are formed in counter-element 12. Diaphragm 11 is implemented in the form of a thin polysilicon layer 3 above counter-element 12 and at a distance from it, so that it may be deflected perpendicularly to the layer planes of MEMS element 100. Diaphragm 11 functions here as a movable electrode of the capacitor system, while the other electrode side is implemented here in the form of a structured metallic coating 5 of counter-element 12. It includes two electrode segments 51 and 52 which are situated concentric to one another, the position, shape and extension of which will be explained in greater detail below with reference to FIGS. 2 and 3. Electrical terminals 15 and 16 for both electrode sides of the capacitor system are formed on each side of cavern 4 in the layered structure.

Figure 2A:
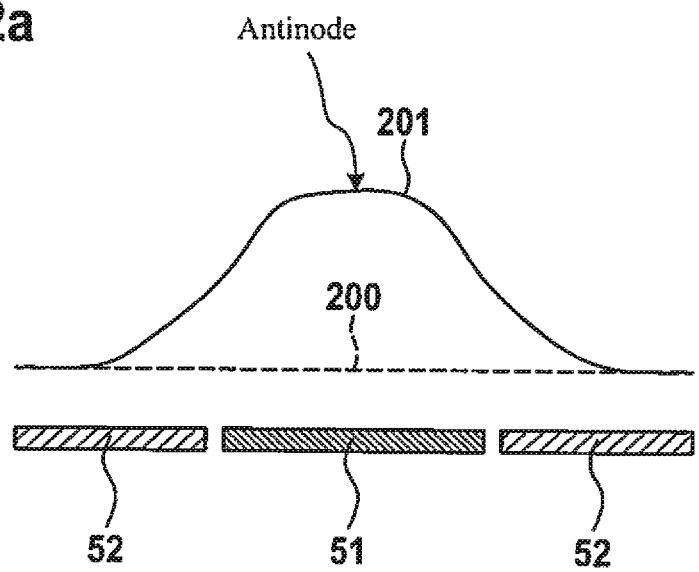
FIGS. 2*a*, 2*b* illustrate the diaphragm deflection of MEMS microphone element 100 in the event of sound exposure (microphone mode—FIG. 2*a*) and at a defined excitation frequency in the event of ultrasound excitation (ultrasound mode—FIG. 2*b*).

In the event of sound exposure, i.e., acoustic signals in a frequency range of 20 Hz to 20 kHz, circular diaphragm 11 is excited to first mode vibrations. During these vibrations, all diaphragm areas, i.e., center area 110 and edge area 111, are deflected from resting position 200 in the same direction. Corresponding diaphragm deformation 201 is illustrated by FIG. 2*a*.

Figure 2B:
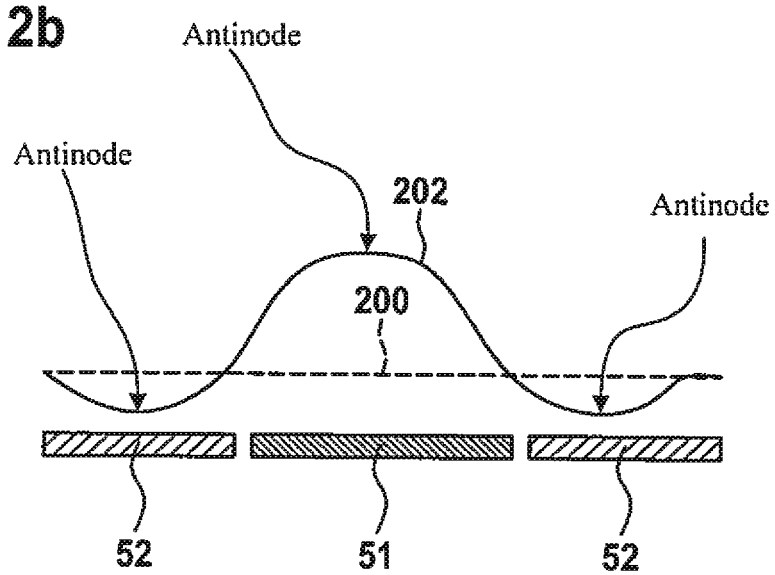

If ultrasound is applied to diaphragm 11, higher modes of vibration are excited. Depending on the excitation frequency, center area 110 and edge area 111 of diaphragm 11 are deflected in opposition. FIG. 2 shows diaphragm deformation 202 when the diaphragm is excited using a defined ultrasound frequency, in this case the 6th mode resonance frequency.

In the exemplary embodiment explained here, the electrode side on counter-element 12 of MEMS element 100 includes two electrode segments 51 and 52 which are separated from one another, which correspond to the position and extension of the vibration antinodes of diaphragm 11, when it is stimulated using the 6th mode resonance frequency. Together with diaphragm electrode 11, both electrode segments 51 and 52 form two partial capacitances $C_1$ and $C_2$ which are independent of one another. With the aid of the capacitor system designed according to the present invention, both acoustically related diaphragm deformations 201 of the microphone mode as well as ultrasound related diaphragm deformations 202 of the ultrasound mode are detected. In the microphone mode, both partial capacitances or their change $\Delta C_1$ and $\Delta C_2$ are added up for that purpose, $$\Delta C_{Microphone\ mode} = \Delta C_1 + \Delta C_2.$$

Since the edge area and the center area of diaphragm 11 are deflected by 180° in a phase-shifted manner, both partial capacitances or their change $\Delta C_1$ and $\Delta C_2$ are subtracted here, $$\Delta C_{Ultrasound\ mode} = \Delta C_1 + \Delta C_2.$$

Figure 3:
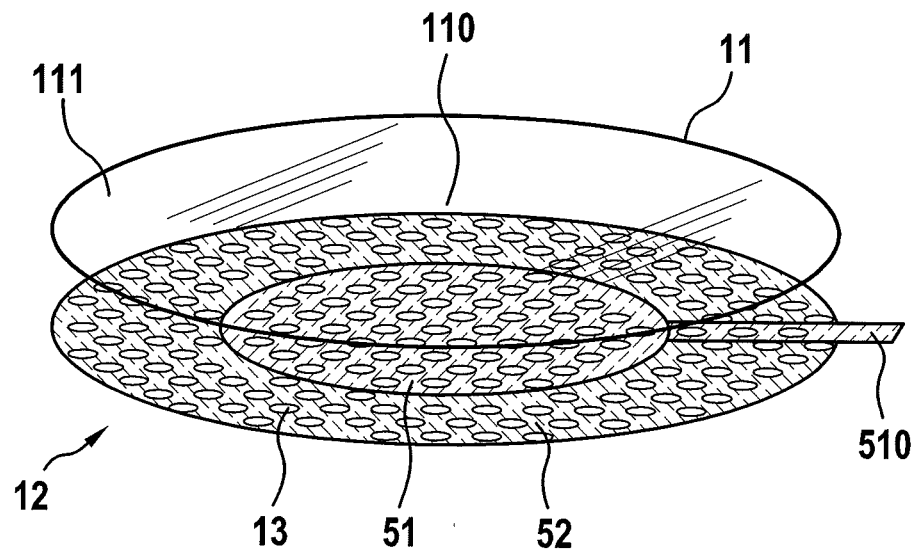
FIG. 3 shows a perspective representation of the counter-element and the diaphragm of MEMS microphone element 100 including the electrodes or electrode segments of the capacitor system designed according to the present invention for signal detection.

The concentric positioning of both electrode segments 51 and 52 on counter-element 12 is shown once again in FIG. 3. FIG. 3 illustrates that both electrode segments 51 and 52 are electrically independent of one another and have their own electrical terminals. Together with its terminal lead 510, inner electrode segment 51 is here electrically isolated from outer electrode segment 52 by a dielectric material. Such electrical separation may, however, also be implemented by an NPN or PNP transition or a corresponding structuring of the counter-element.

Figure 4:
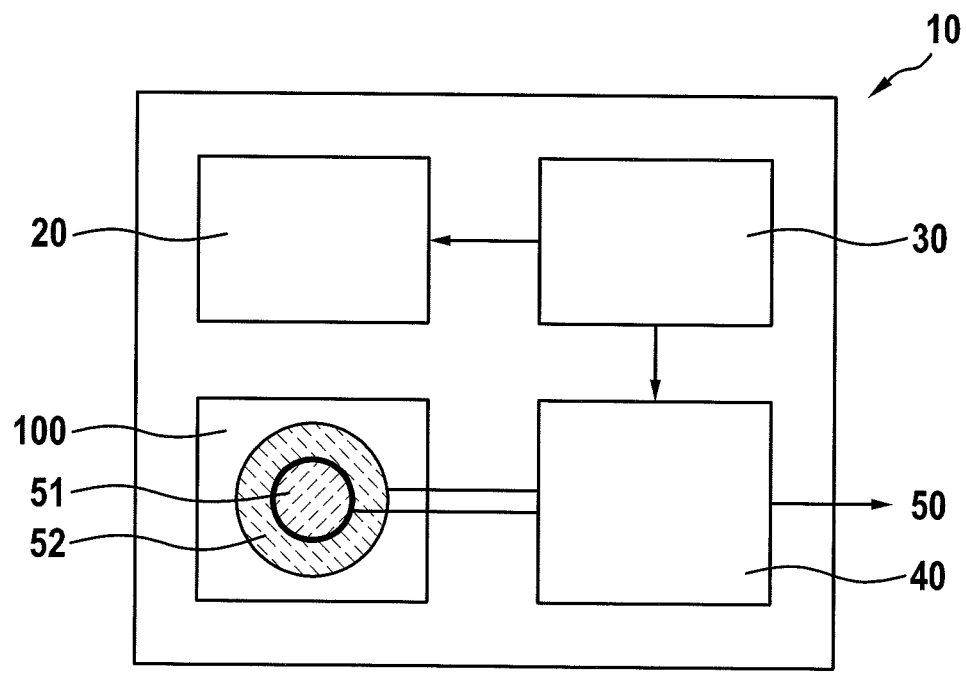
FIG. 4 shows the block diagram of a device according to the present invention including an MEMS microphone element 100.

The block diagram of FIG. 4 illustrates the function of an MEMS microphone element 100, as described above, in the context of a device 10, which makes possible both operation in the microphone mode and operation in ultrasound mode. For that purpose, device 10 includes, in addition to MEMS microphone element 100, an ultrasound transmitter 20, which is optionally activated and deactivated again via a control unit 30. In the ultrasound mode, ultrasound transmitter 20 is activated, so that it transmits ultrasound signals of a defined frequency, namely the frequency to which the layout of electrode segments 51 and 52 of the MEMS microphone element is tuned. In the present case, this is a resonance frequency which excites circular diaphragm 11 to 6th mode vibrations. In the microphone mode, ultrasound transmitter 20 is again deactivated. Control unit 30 also communicates with a signal processing unit 40. It informs signal processing unit 40 of the particular operating mode, microphone mode or ultrasound mode, so that detected partial capacitances $\Delta C_1$ and $\Delta C_2$ may be further processed in a different manner depending on the operating mode. In the microphone mode, output signal 50 is based on either only one partial capacitance $\Delta C_2$ or the sum of both partial capacitances $\Delta C_1$ and $\Delta C_2$ depending on the sound volume level. In the ultrasound mode, both partial capacitances $\Delta C_1$ and $\Delta C_2$ are added up phase shifted by 180°.

What is claimed is:

1. A MEMS microphone element, comprising: at least two carrier elements for two electrode sides of a capacitor system, the carrier elements being formed one above another and at a distance from one another in a layered structure for signal detection, wherein: at least one of the carrier elements is sound pressure-sensitive, at least one of the electrode sides includes at least two electrode segments that are electrically independent of one another, the electrode segments together with the at least one electrode of the other electrode side form partial capacitances which are independent of one another, and a shape, position, and extension of the electrode segments across a surface of the at least one of the electrode sides correspond to a position and extension of vibration antinodes of a sound pressure-sensitive carrier element when the sound pressure-sensitive carrier element is excited to higher mode vibrations using ultrasound of a defined frequency.

2. The MEMS microphone element as recited in claim 1, further comprising:
 a fixed, acoustically permeable counter-element as another carrier element, wherein:
  the electrode segments have a layout tuned to the defined ultrasound frequency,
  the electrode segments are formed on the fixed counter-element, and
  the sound pressure-sensitive carrier element includes a diaphragm.

3. The MEMS microphone element as recited in claim 1, further comprising:
 a fixed, acoustically permeable counter-element as another carrier element, wherein:
  the electrode segments have a layout corresponding to the defined ultrasound frequency,
  the sound pressure-sensitive carrier element includes a diaphragm, and
  the electrode segments are formed on the diaphragm.

4. A device, comprising:
 at least two carrier elements for two electrode sides of a capacitor system, the carrier elements being formed one above another and at a distance from one another in a layered structure for signal detection, wherein:
  at least one of the carrier elements is sound pressure-sensitive,
  at least one of the electrode sides includes at least two electrode segments that are electrically independent of one another,
  the electrode segments together with the at least one electrode of the other electrode side form partial capacitances which are independent of one another, and
  a shape, position, and extension of the electrode segments across a surface of the at least one of the electrode sides correspond to a position and extension of vibration antinodes of a sound pressure-sensitive carrier element when the sound pressure-sensitive carrier element is excited to higher mode vibrations using ultrasound of a defined frequency;
 at least one optionally activatable ultrasound transmitter that transmits ultrasound signals of a defined frequency and to which a layout of the electrode segments is tuned; and
 a signal processing unit for signal evaluation optionally appropriate to one of a microphone mode and an ultrasound mode.

5. The device as recited in claim 4, wherein the at least one optionally activatable ultrasound transmitter transmits ultrasound signals of a higher mode of a resonance frequency of the sound pressure-sensitive carrier element.

6. The device as recited in claim 4, wherein the signal processing unit for signal evaluation is designed in such a way that the signal evaluation in the microphone mode is based on at least one partial capacitance, and that the signal evaluation in the ultrasound mode includes adding up the partial capacitances phase shifted by 180°, wherein the partial capacitances correspond to antinodes in phase opposition of the sound pressure-sensitive carrier element.

7. The device as recited in claim 4, wherein the signal processing unit for signal evaluation is designed in such a way that the partial capacitances in the microphone mode are added up as a function of a signal level of an acoustic signal.

8. The device as recited in claim 4, wherein the signal processing unit for signal evaluation is designed in such a way that the ultrasound mode is used at least one of for localizing an object and for motion detection.

9. The MEMS microphone element as recited in claim 1, wherein the shape and extension of the electrode segments correspond to a deformation of the sound pressure-sensitive carrier element when the carrier element is excited to the higher mode vibrations using ultrasound of the defined frequency.

10. The device as recited in claim 4, wherein the shape and extension of the electrode segments correspond to a deformation of the sound pressure-sensitive carrier element when the carrier element is excited to the higher mode vibrations using ultrasound of the defined frequency.

11. The MEMS microphone element as recited in claim 1, wherein the at least two electrode segments are positioned concentrically to each other.

12. The device as recited in claim 4, wherein the at least two electrode segments are positioned concentrically to each other.

* * * * *